(12) United States Patent
Kwak

(10) Patent No.: US 9,374,075 B2
(45) Date of Patent: Jun. 21, 2016

(54) INPUT APPARATUS AND INPUT SYSTEM

(71) Applicant: SK hynix Inc., Icheon-si Gyeonggi-do (KR)

(72) Inventor: Nohhyup Kwak, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/586,217

(22) Filed: Dec. 30, 2014

(65) Prior Publication Data

US 2016/0065200 A1  Mar. 3, 2016

(30) Foreign Application Priority Data

Sep. 1, 2014 (KR) ................... 10-2014-0115586

(51) Int. Cl.
*H03K 3/356*  (2006.01)
*H03K 7/08*  (2006.01)

(52) U.S. Cl.
CPC ........................................ *H03K 7/08* (2013.01)

(58) Field of Classification Search
USPC .......... 327/115, 116, 117, 118, 199, 355–360, 327/202, 203, 208–215, 218; 377/47, 48
See application file for complete search history.

(56) References Cited

U.S. PATENT DOCUMENTS

| | | | | |
|---|---|---|---|---|
| 5,898,330 A * | 4/1999 | Klass | ............... | H03K 3/356121 326/98 |
| 5,973,529 A * | 10/1999 | Chappell | ............... | H03K 3/0375 327/200 |
| 6,646,487 B2 * | 11/2003 | Nedovic | ............ | H03K 3/356139 327/211 |
| 7,027,345 B2 * | 4/2006 | Nedovic | ..................... | G06F 1/32 326/93 |
| 8,363,485 B2 | 1/2013 | Raghunathan et al. | | |
| 8,508,275 B2 * | 8/2013 | Sathianthan | ........ | H03K 3/35625 327/202 |
| 2002/0140479 A1 * | 10/2002 | Ogawa | .................... | H03K 3/012 327/199 |
| 2007/0257717 A1 * | 11/2007 | Yoon | .................... | G06F 13/4226 327/153 |
| 2009/0237136 A1 * | 9/2009 | Kim | .................. | H03K 3/356104 327/210 |
| 2010/0085086 A1 * | 4/2010 | Nedovic | ................... | H03L 7/091 327/117 |
| 2010/0315144 A1 * | 12/2010 | Lee | ................... | H03K 3/356191 327/211 |
| 2014/0028362 A1 * | 1/2014 | Koike | ............ | G01R 31/318541 327/202 |
| 2015/0222277 A1 * | 8/2015 | Iyer | ........................ | H03L 7/0814 327/116 |

FOREIGN PATENT DOCUMENTS

KR    100670728 B1    1/2007

* cited by examiner

*Primary Examiner* — Brandon S Cole
(74) *Attorney, Agent, or Firm* — William Park & Associates Ltd.

(57) ABSTRACT

An input apparatus may include a pulse width control circuit, a reception circuit, and a latch circuit. The pulse width control circuit may be configured to generate a pulse width control signal by performing a logical operation on a pulse width detection signal and a clock signal. The reception circuit may be configured to selectively provide a received input signal as a period signal on the basis of the clock signal and the pulse width control signal. The latch circuit may be configured to provide an output signal by inverting the period signal, and provide the output signal as the pulse width detection signal in response to the clock signal.

18 Claims, 6 Drawing Sheets

INPUT APPARATUS AND INPUT SYSTEM

CROSS-REFERENCE TO RELATED APPLICATION

This application claims priority based upon Korean patent application No. 10-2014-0115586, filed on Sep. 1, 2014, the disclosure of which is hereby incorporated in its entirety by reference herein.

BACKGROUND

1. Technical Field

Various embodiments generally relate to an input apparatus and an input system, and more particularly to an input circuit and an input system configured to synchronize an input signal at intervals of a predetermined time thereby providing a synchronized result.

2. Related Art

As the operation speed of electronic apparatuses become faster, it becomes difficult to guarantee a margin needed for correctly strobing an input signal. Moreover, if the electronic apparatuses are affected by PVT (Process, Voltage and Temperature) variation, it is difficult to predict a time point of the input signal as well as to guarantee a margin needed for such prediction.

SUMMARY

In an embodiment, an input apparatus may include a pulse width control circuit configured to generate a pulse width control signal by performing a logical operation on a pulse width detection signal and a clock signal. The input apparatus may include a reception circuit configured to selectively provide a received input signal as a period signal on the basis of the clock signal and the pulse width control signal. The input apparatus may include a latch circuit configured to provide an output signal by inverting the period signal, and provide the output signal as the pulse width detection signal in response to the clock signal.

In an embodiment, an input system may include a controller configured to provide data and an operation command. The input system may include an input apparatus configured to synchronize at least one of the data and the operation command with a clock signal, perform pulse width control in a manner that the synchronized one has the same pulse width as in at least one cycle of the clock signal, and provide the pulse-width-controlled result as an output signal.

DETAILED DESCRIPTION

Reference will now be made in detail to the embodiments, examples of which are illustrated in the accompanying drawings. Wherever possible, the same reference numbers will be used throughout the drawings to refer to the same or like parts.

In association with the embodiments, specific structural and functional descriptions are disclosed only for illustrative purposes, the embodiments can be implemented in various ways without departing from the scope or spirit of the application.

Various embodiments may be directed to providing an input apparatus and an input system that substantially obviates one or more problems due to limitations and disadvantages of the related art.

Various embodiments may relate to an input apparatus and an input system configured to output an input signal to have a predetermined pulse width, irrespective of a pulse width of the original input signal.

Various embodiments may relate to an input apparatus and an input system synchronized with a clock signal irrespective of a provision time of an input signal so as to provide input signals selectively including various pulse widths, such that the input apparatus and the input system can operate without considering the margin.

Figure 1:
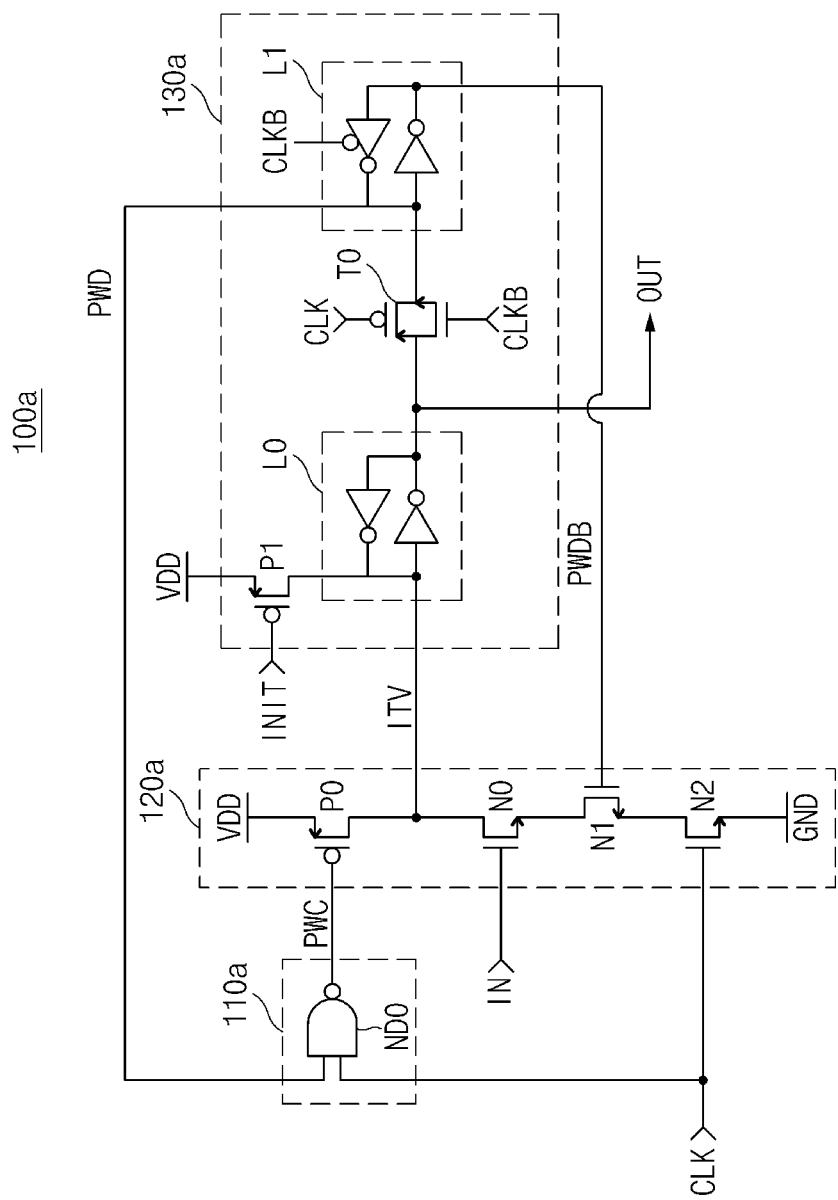
FIG. 1 is a circuit diagram illustrating a representation of an input apparatus according to an embodiment.

FIG. 1 is a circuit diagram illustrating a representation of an input apparatus according to an embodiment.

Referring to FIG. 1, the input apparatus 100*a* may include a pulse width control circuit 110*a*, a reception circuit 120*a*, and a latch circuit 130*a*.

The input apparatus 100*a* receives an input signal IN and provides an output signal OUT. The output signal OUT may have the same pulse width as in at least one cycle of a clock signal CLK. Although the input signal IN is provided through a path different from that of the clock signal CLK and the input signal IN is provided with skew, the input signal IN is synchronized with the clock signal CLK, resulting in an increased strobing accuracy of the input signal IN. Moreover, the input signal IN is synchronized with the clock signal CLK and has the same pulse width as that of the clock signal CLK, so that there may be no need to consider the margin of the input signal IN.

The pulse width control circuit 110*a* performs a logical operation on a pulse width detection signal PWD and the clock signal CLK, and outputs a pulse width control signal PWC. The pulse width control circuit 110*a* may include a logical NAND operator ND0. The logical NAND operator ND0 may perform a logical NAND operation on the pulse width detection signal PWD and the clock signal CLK using the logical NAND operation ND0. In an embodiment, the pulse width control circuit 110*a* provides a pulse width control signal PWC having a logical low value only when the pulse width detection signal PWD and the clock signal CLK are at a logical high level.

The reception circuit 120*a* may selectively provide the input signal IN as a period signal ITV based on the clock signal CLK and the pulse width control signal PWC.

In accordance with an embodiment, the reception circuit 120*a* inverts the input signal IN in response to the clock signal CLK, and provides the inverted input signal as the period signal ITV. Otherwise, the reception signal 120*a* may transit the period signal ITV to a predetermined value in response to the pulse width control signal PWC.

The reception circuit 120*a* may include a synchronization circuit N2, an input provision circuit N0, and a control circuit P0. The synchronization circuit N2 is coupled to a ground voltage (GND) terminal.

The synchronization circuit N2 provides a ground voltage GND in response to the clock signal CLK. The input provision circuit N0 provides the ground voltage GND as a period signal ITV in response to the input signal IN. The control circuit P0 is coupled to a power-supply voltage (VDD) terminal. The control circuit P0 provides the power-supply voltage VDD as a period signal ITV in response to the pulse width control signal PWC.

Referring to the operations of the reception circuit 120a, if the ground voltage GND is applied to one terminal of the input provision circuit N0 in response to the clock signal CLK, the input provision circuit N0 receives an inversion value of the input signal IN through the other terminal thereof, and outputs the inverted input signal IN as a period signal ITV. During the duration time of the clock signal CLK, the input signal IN is inverted so that the inverted input signal IN can be provided as the period signal ITV. Thereafter, upon receiving the pulse width control signal PWC through the pulse width control circuit 110a, the reception circuit 120a may transit the period signal ITV in such a manner that the period signal ITV has a power-supply voltage VDD irrespective of the input signal IN.

Therefore, the input signal IN may be initially inverted to the period signal ITV in response to the clock signal CLK, and the period signal ITV may transit to the power-supply voltage VDD in response to the pulse width control signal PWC, such that the pulse width is decided irrespective of the input signal IN.

There may be a case where a time interval during the input signal IN is inverted and provided as the period signal ITV and a time interval during the power-supply voltage VDD is provided as the period signal by the pulse width detection signal PWD are overlapping each other. In this case, the reception circuit 120a between the power-supply voltage (VDD) terminal and the ground voltage (GND) terminal are electrically interconnected, so that the value of the period signal ITV becomes ambiguous.

Accordingly, the reception circuit 120a according to an embodiment may further include a path blocking circuit N1. Before the pulse width control circuit 110a activates the pulse width detection signal PWD and provides the pulse width control signal PWC in response to the clock signal CLK, the path blocking circuit N1 may block a path formed by the clock signal CLK of the reception circuit 120a, such that the input signal IN is not provided as the period signal ITV in response to the pulse width control signal PWC.

In accordance with an embodiment, each of the input provision circuit N0 and the path cut-off circuit N1 may be implemented as an NMOS transistor. The control circuit P0 may be implemented as a PMOS transistor.

The latch circuit 130a inverts the period signal ITV to provide an output signal OUT. In response to the clock signal CLK, the latch circuit 130a may provide the output signal OUT as the pulse width detection signal PWD.

The reception circuit 120a may invert the input signal IN during at least one cycle of the clock signal CLK. The reception circuit 120a may provide the inverted signal as the period signal ITV. The output signal OUT indicating the inverted signal of the period signal ITV may correspond to a pulse-width-controlled input signal IN.

In addition, the latch circuit 130a may shift the output signal OUT in response to the clock signal CLK and thus provide the pulse width detection signal PWD.

The output signal OUT may be generated when the input signal IN is received from the reception circuit 120a in response to a rising edge of the clock signal CLK. If the output signal OUT is sequentially shifted in response to each edge of consecutive clock signals CLK and the shifted result is provided as the pulse width detection signal PWD, the pulse width detection signal PWD generated after a predetermined period of the clock signal CLK elapses from a provision start time of the output signal OUT may be applied to the pulse width control circuit 110a. For example, according to the latch circuit 130a of FIG. 1, after lapse of one cycle of the clock signal CLK upon receiving the output signal OUT, the pulse width detection signal PWD is activated and applied to the pulse width control circuit 110a.

The latch circuit 130a may include a first latch L0. The latch circuit 130a may include a transfer gate T0. The first latch L0 latches the period signal ITV, inverts the period signal ITV, and provides the inverted resultant signal as the output signal OUT. In response to the clock signal CLK, the transfer gate T0 may provide the output signal OUT as the pulse width detection signal PWD.

In accordance with an embodiment, the latch circuit 130a may further include a second latch L1. The second latch L1 may be configured to latch the output signal of the transfer gate T0. The second latch L1 may be operated by the only inverter in response to the clock signal CLK. The second latch L1 may invert the pulse width detection signal PWD to provide an inverted pulse width detection signal PWDB.

In accordance with an embodiment, the second latch L1 may include a three-phase (3-phase) inverter electrically coupled between the output terminal and the input terminal. The three-phase inverter may operate as a simple inverter or latch in response to the inverted clock signal CLKB.

In accordance with an embodiment, the latch circuit 130a may further include an initialization circuit P1. The initialization circuit P1 may initialize the period signal ITV to the power-supply voltage VDD in response to the initialization signal INIT. For example, the initialization circuit 130a may correspond, for example, to a PMOS transistor.

As can be seen from FIG. 1, the input signal IN is inverted by interconnection between the power-supply voltage (VDD) terminal and the ground voltage (GND) terminal, such that the reception circuit 120a may be implemented as a combination of a PMOS transistor and NMOS transistors. However, the scope or spirit of the input device 100a according to the embodiments is not limited thereto, and the input device 100a can be implemented in various ways without departing from the scope or spirit of this application.

Figure 2:
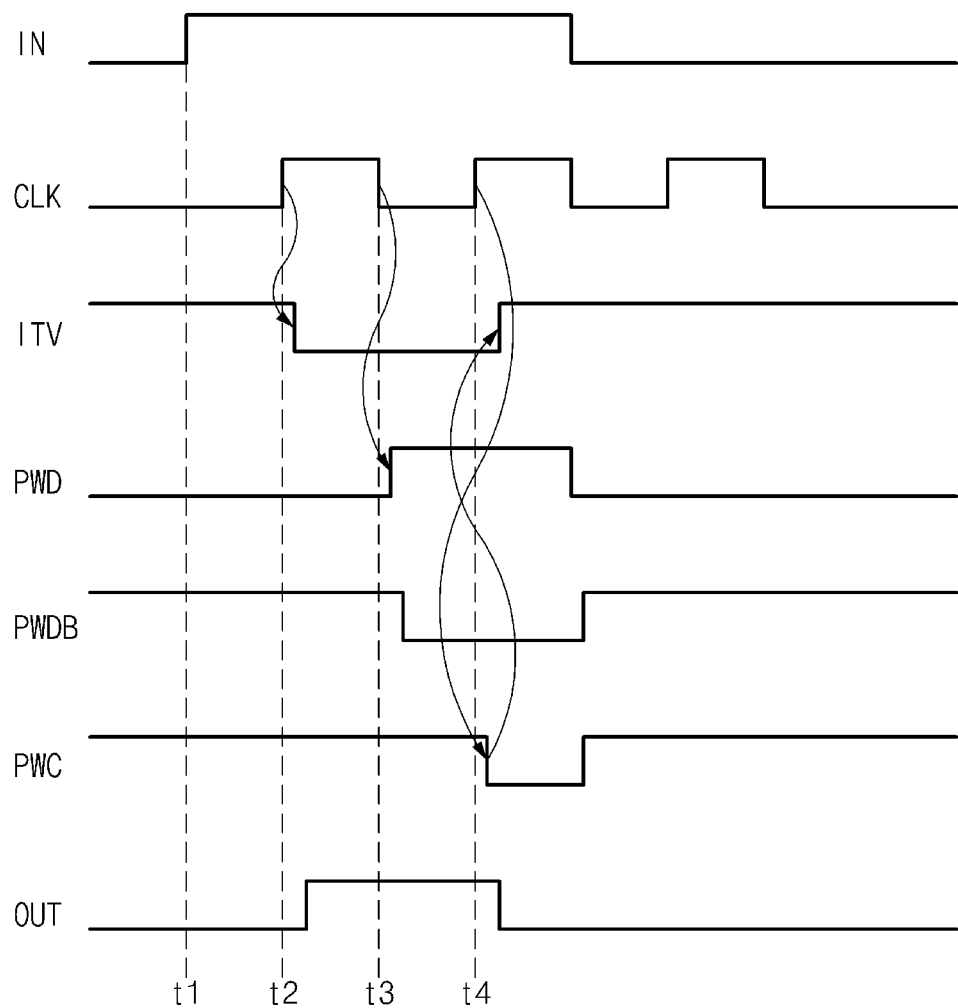
FIG. 2 is a timing diagram illustrating a representation of the operations of the input apparatus illustrated in FIG. 1.

FIG. 2 is a timing diagram illustrating a representation of the operations of the input apparatus 100a illustrated in FIG. 1.

The input apparatus 100a illustrated in FIG. 1 will hereinafter be described with reference to FIG. 2.

Although FIG. 2 illustrates that a generation time of the clock signal CLK is controllable so that the clock signal CLK begins to be generated from a time point (t2), the scope or spirit of this application is not limited thereto. When it is impossible to control the generation time point of the clock signal CLK, the clock signal CLK may correspond to a logical high state at a provision time (t1) of the input signal IN. When the clock signal CLK corresponds to the logical high state at the time point (t1) of the input signal IN, the output signal OUT may be provided at the time point (t1).

Therefore, if it is impossible for the input device 100a to control generation timing of a signal for strobing the input signal IN (i.e., the clock signal CLK), a margin between the rising edge of the input signal IN and the clock signal CLK needs to be considered. However, a margin between the clock signal CLK and a falling edge of the input signal IN need not be considered.

However, if the generation time of the clock signal CLK can be controlled, the input signal IN is generated and the clock signal CLK is provided, then the input signal IN is provided in response to the clock signal CLK. Then the latter part of the input signal IN is terminated by the pulse width (e.g. in response to the pulse with control signal PWC). Therefore, margin of the rising edge and the falling edge of the input signal IN need not be considered at all.

The input apparatus 100a is in an initialization state prior to the time point (t1). Referring to FIG. 2, initialization states of respective signal values may be maintained according to a value of the initialization circuit P1.

At the time point (t1), the input signal IN is provided, the clock signal CLK is not activated in the reception circuit 120a, and an initial value of the period signal ITV is maintained at a logical high level corresponding to the power-supply voltage VDD, such that the input signal IN is not provided as the period signal ITV.

At the time point (t2), the ground voltage GND is applied to the input provision circuit N0 through the synchronization provision circuit N2 and the path blocking circuit N1 in response to the rising edge of the clock signal CLK. The input provision circuit N0 may provide the ground voltage GND as the period signal ITV in response to the input signal IN. If the input signal IN of the input provision circuit N0 is at a logical high level, the input provision circuit N0 may provide the ground voltage GND serving as the period signal ITV, so that the input provision circuit N0 may be operated in a substantially same manner as the above operation that the input signal IN is inverted and provided as the period signal ITV.

The period signal ITV may be latched by the first latch L0. The inverted signal of the period signal ITV may be provided as the output signal OUT. The input signal IN may be provided as an output signal OUT at the rising edge of the clock signal CLK.

The transfer gate T0 is not coupled according to the clock signal CLK at the time point (t2), so that the pulse width detection signal PWD can be maintained at its own initialization state at the time point (t2).

The transfer gate T0 is connected at the time point (t3), so that the output signal OUT is provided as the pulse width detection signal PWD at the time point (t3). At the time point (t3), the pulse width detection signal PWD is applied to the pulse width control circuit 110a, and is inverted by the second latch L1, so that the inverted pulse width detection signal PWDB indicating the inverted result may be applied to the path blocking circuit N1 of the reception circuit 120a.

The reception circuit 120a receives the pulse width detection signal PWD having a logical high level. Thereafter, in response to the clock signal CLK at the time point (t4), the reception circuit 120a may be ready to output the pulse width control signal PWC having a logical low level.

The path blocking circuit N1 is turned off in response to the inverted pulse width detection signal PWDB, so that an electrical path between a node for receiving the period signal ITV of the reception circuit 120a and the ground voltage (GND) terminal is isolated.

The pulse width control circuit 110a may output the pulse width control signal PWC having a logical low level to the reception circuit 120a, in response to the rising edge of the clock signal CLK at the time point (t4). The reception circuit 120a may transit the period signal ITV to the power-supply voltage VDD irrespective of the input signal IN, in response to the pulse width control signal PWC. The output signal OUT may correspond to a logical low level irrespective of the input signal in response to a variation of the period signal ITV.

Accordingly, the output signal OUT may have the same values as those of the input signal IN ranging from the time point t1 to the time point t4. Consequently, the output signal OUT may be identical to a signal obtained when the input signal IN is severed using the clock signal CLK as one cycle.

As described above, the input apparatus 100a according to the embodiments may sever the input signal IN in response to the rising edge and the falling edge of the clock signal CLK, and provide a severed segment of the input signal IN as the output signal OUT. Accordingly, the output signal OUT has a predetermined period in synchronization with the clock signal CLK, so that the output signal OUT can be synchronized without consideration of a skew between the clock signal CLK and the output signal OUT and need not consider the margin.

The input apparatus 100a according to the embodiment enables the input signal IN to have a pulse width corresponding to one cycle of the clock signal CLK, so that the input apparatus 100a provides the resultant signal as the output signal OUT. However, according to the number of times the latch circuit 130a shifts the clock signal CLK, the input apparatus 100a may provide the output signal OUT having pulse widths corresponding to various periods of the clock signal CLK.

Figure 3:
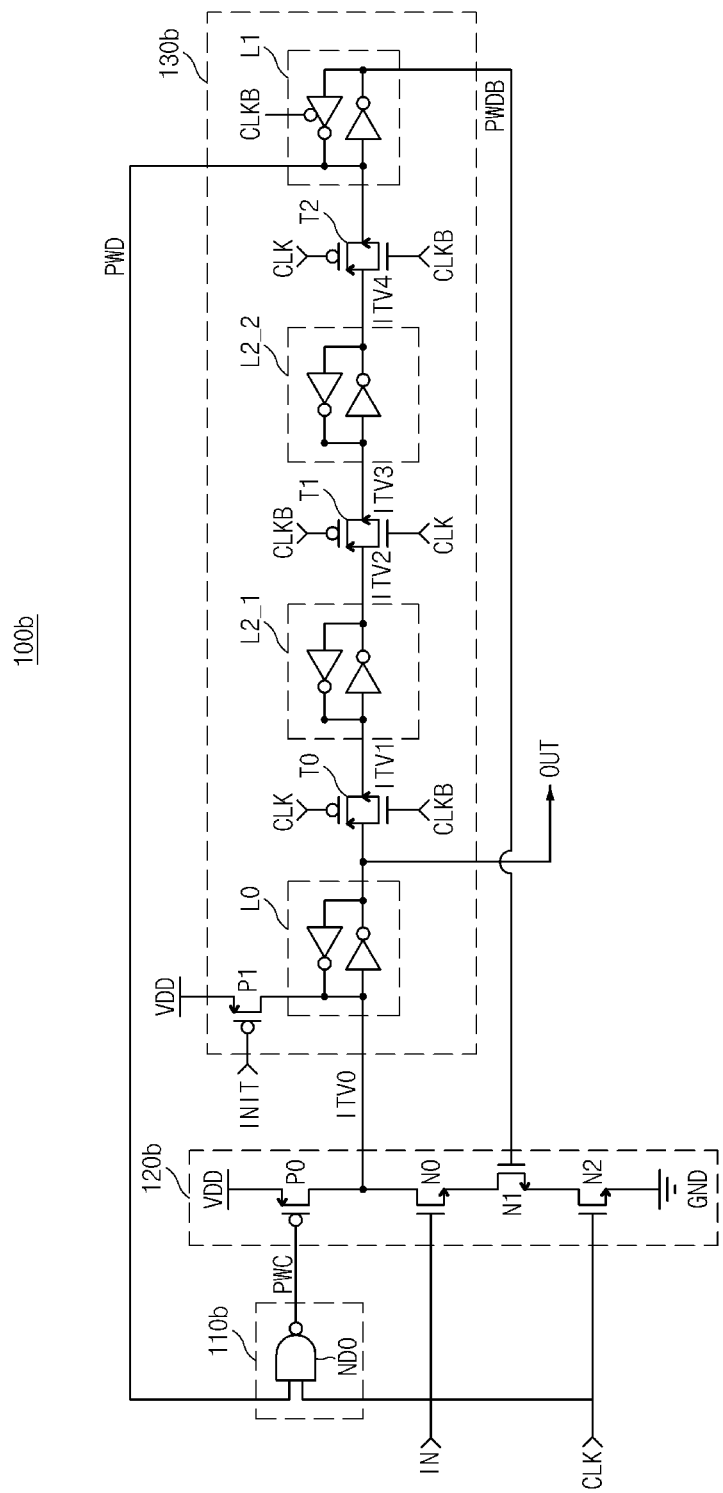
FIG. 3 is a circuit diagram illustrating a representation of an input apparatus according to an embodiment.

FIG. 3 is a circuit diagram illustrating a representation of an input apparatus according to an embodiment.

Referring to FIG. 3, the input apparatus 100b may include a pulse width control circuit 110b, a reception circuit 120b, and a latch circuit 130b. The pulse width control circuit 110b and the reception circuit 120b illustrated in FIG. 3 are respectively substantially identical to the pulse width control circuit 110a and the reception circuit 120a illustrated in FIG. 1, and as such a detailed description thereof will herein be omitted for convenience of description. In FIG. 3, the same reference numerals as those of FIG. 1 will be used to refer to the same or like parts.

The input apparatus 100b inverts a first period signal ITV0 received in response to the rising edge of the clock signal CLK, and outputs the inverted resultant signal as the output signal OUT. Thereafter, the input apparatus 100b provides the pulse width detection signal PWD by sequentially shifting the output signal OUT in response to respective edges of the clock signal CLK, so that the input apparatus 100b can provide the output signal OUT having a pulse width corresponding to at least one cycle of the clock signal (e.g., two cycles of the clock signal CLK in FIG. 3).

The latch circuit 130b contained in the input apparatus 100b may include a first latch L0, and one or more transfer gates T0, T1 and T2. The latch circuit 130b may include a second latch L1, and one or more third latches L2_1 and L2_2. The first latch L0 receives a first period signal ITV0 from the reception signal 120b to latch the first period signal ITV0. The first latch L0 inverts the first period signal ITV0 to provide the inverted result as the output signal OUT. The transfer gates T0, T1 and T2 may be alternately connected in response to the clock signal CLK. The third latch L2_1 may latch the output signal of the transfer gate T0. The other third latch L2_2 may latch the output signal of the transfer gate T1.

The first latch L0 and the second latch L1 illustrated in FIG. 3 are substantially identical to those of the input apparatus 100a of FIG. 1. The inverted first period signal ITV0 may be provided as the output signal through the first latch L0. In response to the rising edge of the clock signal CLK, the first period signal ITV0 corresponding to inversion of the input signal IN is provided through the reception circuit 120b, so that the output signal OUT of the input apparatus 100b is also provided from the rising edge of the clock signal CLK.

During the next half (½) cycle of the clock signal CLK, for example, in response to the next falling edge of the clock signal CLK, the output signal OUT may be provided as a second period signal ITV1 through the first transfer gate T0.

A third period signal ITV2 corresponding to inversion of the second period signal ITV1 may be provided as a fourth period signal ITV3 through the second transfer gate T1, during the next half (½) cycle of the clock signal CLK. For example, in response to the next rising edge of the clock signal CLK, the third period signal ITV2 corresponding to inversion of the second period signal ITV1 may be provided as the fourth period signal ITV3 through the second transfer gate T1.

The first period signal ITV0 is shifted during the 3/2 cycle of the clock signal CLK through the same processing, and then provided as the pulse width detection signal PWD. In addition, the second latch L1 inverts the pulse width detection signal PWD and thus provides the inverted pulse width detection signal PWDB, so that the path blocking circuit N1 is turned off.

The pulse width control circuit 110b may await the successive rising edge of the clock signal CLK in response to the pulse width detection signal PWD. Thereafter, in response to the rising edge of the clock signal CLK, the pulse width control circuit 110b may transit the pulse width control signal PWC to a logical low level, so that the first period signal ITV0 may transit to the power-supply voltage VDD.

As a result, starting with the reception of the first period signal ITV0, the output signal OUT may transit to the ground voltage GND after the lapse of two cycles of the clock signal CLK.

Compared to the input apparatus 100a illustrated in FIG. 1, the input apparatus 100b illustrated in FIG. 3 may further include one or more third latches L2_1 and L2_2. Compared to the input apparatus 100a illustrated in FIG. 1, the input apparatus 100b illustrated in FIG. 3 may further include one or more transfer gates T1 and T2. The third latches L2_1 and L2_2 and the transfer gates T1 and T2 may be disposed between or electrically coupled between the first latch L0 and the second latch L1.

Therefore, after the output signal OUT is shifted after passing through many subsequent rising- and falling-edges of the clock signal CLK, the output signal OUT may be provided as the pulse width detection signal PWD to the pulse width control circuit 110b.

In other words, when the latch circuit 130b sequentially shifts the output signal OUT in response to the clock signal CLK, a duration time in which the input signal IN is provided as the output signal OUT increases.

Figure 4:
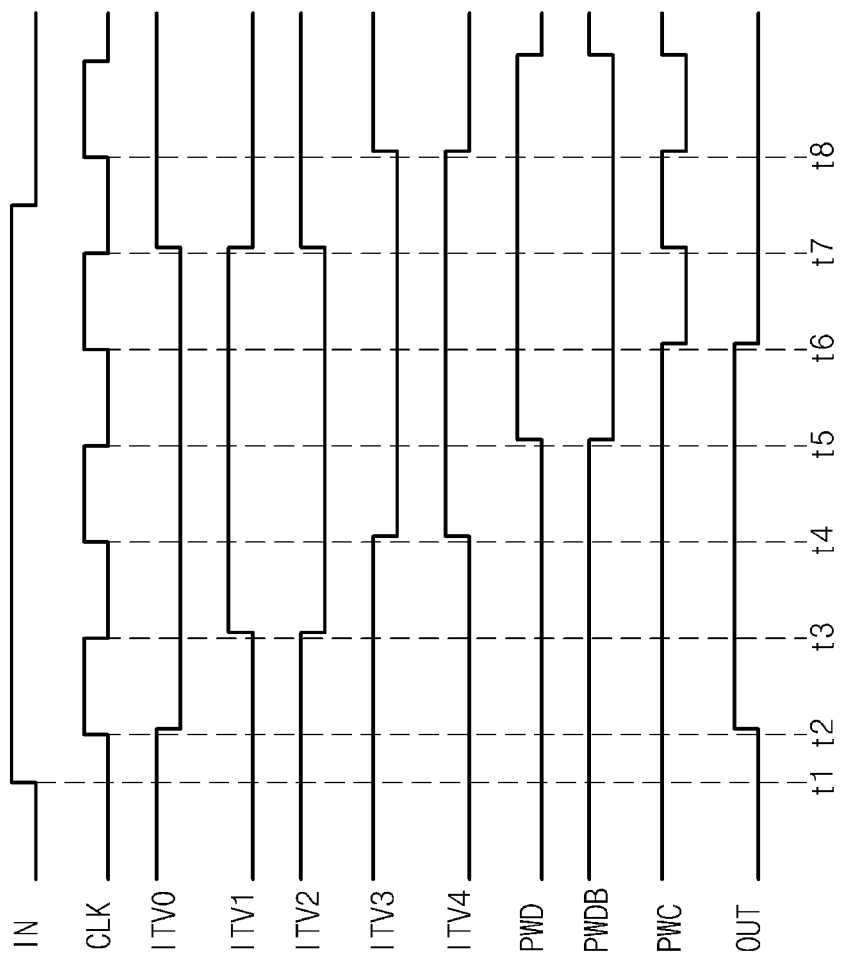
FIG. 4 is a timing diagram illustrating a representation of the operations of the input apparatus illustrated in FIG. 3.

FIG. 4 is a timing diagram illustrating a representation of the operations of the input apparatus illustrated in FIG. 3.

Referring to FIG. 4, the signal waveforms ranging from a first time point (t1) to a second time point (t2) illustrated in FIG. 4 are identical to those of FIG. 2. In FIGS. 4 and 2, the input signal IN is provided in an initialization state at the time point (t1). In addition, at the time point (t2), the input signal IN is inverted in response to the rising edge of the clock signal CLK so that the inverted input signal is provided as the first period signal ITV0.

At the time point (t3), the first transfer gate T0 is connected so that the output signal OUT can be shifted to a second period signal ITV1. At the time point (t4), the second transfer gate T1 is connected so that the resultant output signal OUT is shifted to a fourth period signal ITV3 through the second transfer gate T1. The third latches L2_1 and L2_2 may latch and invert the second period signal ITV1 and the fourth period signal ITV3 respectively received from the first and second transfer gates T0 and T1, so that the third latch L2_1 outputs a third period signal ITV2 and the third latch L2_2 outputs a fifth period signal ITV4.

In summary, the input apparatus 100b of FIG. 3 sequentially shifts the first period signal ITV0 in response to the clock signal CLK ranging from the time point (t3) to the time point (t5), and provides a fifth period signal ITV4, so that a retention time of the output signal OUT increases.

At the time point (t5), the fifth period signal ITV5 may be provided as the pulse width detection signal PWD through the third transfer gate T2. The pulse width detection signal PWD is inverted by the second latch L1, and is thus provided as the inverted pulse width detection signal PWDB to the path blocking circuit N1.

The pulse width control circuit 110b answers the rising edge of the clock signal CLK using the pulse width detection signal PWD, so that the pulse width control circuit 110b is ready to transit the pulse width control signal PWC to a logical low level. If the reception circuit 120b provides the first period signal ITV0 corresponding to power-supply voltage VDD in response to the pulse width control signal PWC, the path blocking circuit N1 may blocks an electrical path of the reception circuit 120b in a manner that the ground voltage GND responding to the clock signal CLK is not provided.

At the time point (t6), the pulse width control signal PWC transits to a logical low level in response to the rising edge of the clock signal CLK, so that the first period signal ITV0 may transit to the power-supply voltage VDD and the output signal OUT may have the ground voltage GND irrespective of the input signal IN.

At the time point (t7), the clock signal CLK is at a logical low level, so that the pulse width control signal PWC is at a logical high level. The second and third period signals ITV1 and ITV2 are shifted in response to the clock signal CLK, and the clock signal CLK is at a logical high level, such that the fourth and fifth period signals ITV3 and ITV4 are shifted.

As previously stated in FIGS. 3 and 4, the latch circuit 130b further includes at least one latch and at least one transfer gate, resulting in an increased time period in which the output signal OUT is shifted in response to the clock signal CLK. Therefore, the pulse width of the output signal OUT can be controlled according to the number of shift times of the clock signal CLK for use in the latch circuit 130b.

Figure 5:
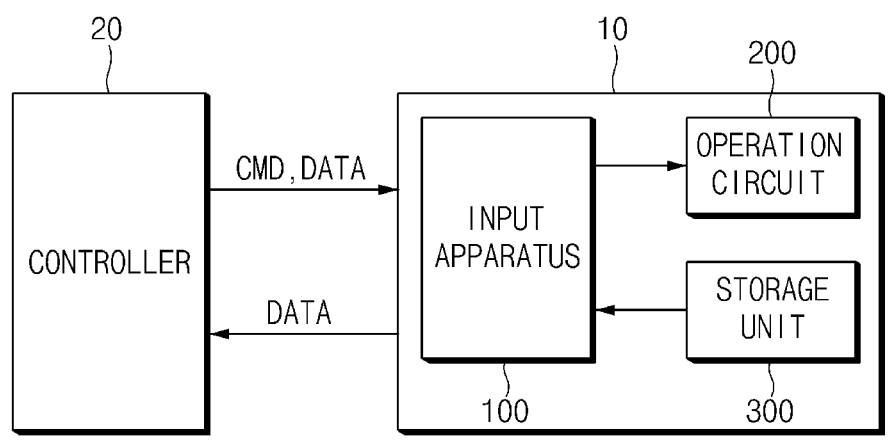
FIG. 5 is a block diagram illustrating a representation of an input system including the input apparatus according to an embodiment.

FIG. 5 is a block diagram illustrating a representation of an input system 1 including the input apparatus 100a and 100b according to an embodiment.

Referring to FIG. 5, the input system 1 may include not only an operation device 10 including an input apparatus 100 (e.g., the input apparatus 100a of FIG. 1 and the input apparatus 100b of FIG. 3), but also a controller 20.

The controller 20 may provide data DATA and an operation command CMD to the operation device 10. In addition, the controller 20 may also provide, for example, addresses, configuration information, etc. to the operation device 10.

The controller 20 may be embedded in a processor of electronic devices (for example, a Central Processing Unit (CPU), an Application Processor (AP), a Graphic Processing Unit (GPU), etc.), or may be configured in the form of a System on Chip (SoC) and be fabricated in one chip along with the processors. The controller 20 may further include an interface composed of, for example, a physical layer (PHY), a phase lock loop (PLL) circuit, etc.

The input apparatus 100 contained in the operation device 10 enables at least one of the data DATA and the operation command CMD to be synchronized with the clock signal CLK, performs pulse width control in a manner that the synchronization result has the same pulse width as in at least one cycle of the clock signal CLK.

Although not illustrated in FIG. 5, the clock signal CLK may be provided from the controller 20 to the operation device 10. The clock signal CLK may be generated from the inside of the operation device 10.

The input apparatus 100 of FIG. 5 may have substantially the same structure as in at lease one of the input apparatuses 100*a* of FIG. 1 and the input apparatuses 100*b* of FIG. 3, and as such a detailed description thereof will herein be omitted for convenience of description.

The operation device 10 may further include an operation circuit 200. The operation circuit 200 may be configured to perform internal operations on the basis of a pulse-width-controlled operation command received through the input apparatus 100. For example, the operation circuit 200 may include a write driver, a sense amplifier, a page buffer, a decoder, an input/output (I/O) interface, etc.

In addition, the operation device 10 may further include a storage unit 300. The storage unit 300 may be configured to store data having a pulse width controlled through the input device 100. For example, the storage unit 300 may include a volatile memory and a non-volatile memory.

The operation circuit 200 contained in the operation device 10 may write or read data in or from the storage unit on the basis of an operation command CMD.

Since the operation device 10 includes the input apparatus 100 as discussed above, the operation device 10 can correctly read a operation command CMD without considering the margin when reading data DATA or the operation command CMD in response to the clock signal CLK.

As described above, the input apparatus 100*a* and 100*b* and the input system 1 may provide an input signal IN as the output signal OUT having a pulse width synchronized with at least one cycle of the clock signal CLK. Therefore, the input apparatus and the input system according to the embodiments may provide the output signal OUT synchronized with the clock signal CLK irrespective of PVT variation, such that the input apparatus and the input system may provide the input signal IN without considering the margin related to the clock signal CLK.

Moreover, the input apparatus 100*a* and 100*b* and the input system 1 according to the various embodiments can adjust the pulse width of the input signal IN according to various cycles of the clock signal CLK, such that the input apparatus and the input system 1 may correctly operate according to data or the operation command.

As is apparent from the above description, the input apparatus and the input system according to the embodiments can adjust a pulse width of the input signal in a manner that the input signal has the same period as a clock period in a manner that the input signal and the clock signal are provided through different paths, such that the input signal has a pulse width needed for synchronization with the clock signal even when time synchronization between two signals is changed.

The input apparatus and the input system according to the embodiments can provide an input signal insensitive to PVT variation, such that the input apparatus and the input system can be minimally affected by PVT variation, resulting in an increased operation stability of electronic appliances.

Figure 6:
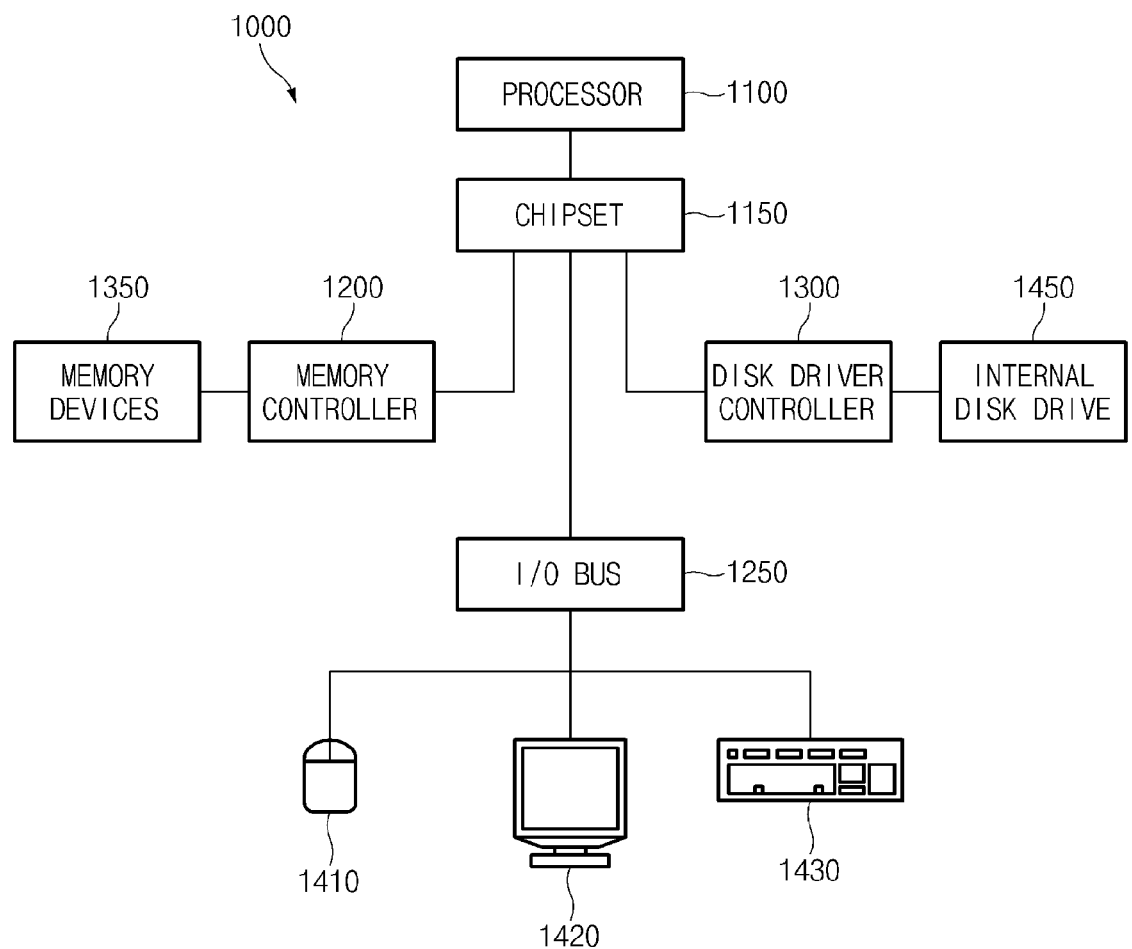
FIG. 6 illustrates a block diagram of an example of a representation of a system employing the input apparatus and/or input system in accordance with the embodiments discussed above with relation to FIGS. 1-5.

The input apparatuses and input systems discussed above (see FIGS. 1-5) are particular useful in the design of memory devices, processors, and computer systems. For example, referring to FIG. 6, a block diagram of a system employing the input apparatuses and/or input systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one input apparatus and/or input system as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one input apparatus and/or input system as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the input apparatuses and/or input systems as discussed above with relation to FIGS. 1-5. In alternate embodiments, such as cellular phones or digital cameras, the components may differ from the embodiments illustrated in FIG. 6.

Those skilled in the art will appreciate that the various embodiments may be carried out in other specific ways than those set forth herein without departing from the spirit and essential characteristics of this application. The above examples of embodiments are therefore to be construed in all aspects as illustrative and not restrictive. The scope of the embodiments should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an example of an embodiment or included as a new claim by a subsequent amendment after the application is filed.

Although a number of illustrative embodiments consistent with this application have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An input apparatus comprising:
   a pulse width control circuit configured to generate a pulse width control signal by performing a logical operation on a pulse width detection signal and a clock signal;
   a reception circuit configured to selectively provide a received input signal as a period signal based on the clock signal and the pulse width control signal; and
   a latch circuit configured to provide an output signal by inverting the period signal, and provide the output signal as the pulse width detection signal in response to the clock signal,
   wherein the reception circuit further includes:
     a path blocking circuit configured to block a path wherein the input signal is inverted so that the inverted resultant signal is provided as the period signal in response to an inverted pulse width detection signal corresponding to inversion of the pulse width detection signal.

2. The input apparatus according to claim 1, wherein the reception circuit inverts the input signal in response to the clock signal, provides the inverted input signal as the period signal, and transits the period signal to a predetermined value in response to the pulse width control signal.

3. The input apparatus according to claim 1, wherein the reception circuit further includes:
   a synchronization circuit coupled to a first voltage, configured to provide the first voltage to the path blocking circuit in response to the clock signal;
   an input provision circuit configured to provide the first voltage as the period signal in response to the input signal; and
   a control circuit coupled to a second voltage having a logical state opposite to that of the first voltage, configured to provide the second voltage as the period signal in response to the pulse width control signal to transit the period signal to the predetermined value.

4. The input apparatus according to claim 3, wherein:
   the synchronization circuit, the input provision circuit, and the path blocking circuit each include a NMOS transistor; and
   the control circuit includes a PMOS transistor.

5. The input apparatus according to claim 3, wherein the first voltage is a voltage corresponding to a logical low level, and the second voltage is a voltage corresponding to a logical high level.

6. The input apparatus according to claim 3, wherein the latch circuit further includes:
   an initialization circuit configured to initialize the period signal to the second voltage in response to an initialization signal.

7. The input apparatus according to claim 6, wherein the initialization circuit includes a PMOS transistor.

8. The input apparatus according to claim 1, wherein the latch circuit includes:
   a first latch configured to latch the period signal, invert the period signal, and provide the inverted resultant signal as the output signal; and
   at least one transfer gate configured to provide the output signal as the pulse width detection signal in response to the clock signal.

9. The input apparatus according to claim 8, wherein the latch circuit further includes:
   at least one second latch configured to latch an output signal of the transfer gate.

10. The input apparatus according to claim 1, wherein the pulse width control circuit performs a logical NAND operation on the pulse width detection signal and the clock signal.

11. An input system comprising:
    a controller configured to provide data and an operation command; and
    an input apparatus configured to synchronize at least one of the data and the operation command with a clock signal, perform pulse width control in a manner that the synchronized one of the data and the operation command has the same pulse width as in at least one cycle of the clock signal, and provide the pulse-width-controlled signal as an output signal,
    wherein the input apparatus includes:
      a reception circuit configured to selectively provide at least one of the data and the operation command as a period signal based on the clock signal and a pulse width control signal,
      wherein the reception circuit further includes:
        a path blocking circuit configured to block a path wherein the input signal is inverted and the inverted resultant signal is provided as the period signal in response to an inverted pulse width detection signal corresponding to inversion of the pulse width detection signal.

12. The input system according to claim 11, wherein the input apparatus includes:
    a pulse width control circuit configured to generate the pulse width control signal by performing a logical operation on a pulse width detection signal and a clock signal; and
    a latch circuit configured to provide the output signal by inverting the period signal, and provide the output signal as the pulse width detection signal in response to the clock signal.

13. The input system according to claim 12, wherein the input apparatus further includes:
    an operation circuit configured to perform an internal operation based on the pulse-width-controlled operation command.

14. The input system according to claim 13, wherein the reception circuit inverts the input signal in response to the clock signal, provides the inverted resultant signal as the period signal, and transits the period signal to a predetermined value in response to the pulse width control signal.

15. The input system according to claim 14, wherein the reception circuit further includes:
    a synchronization circuit coupled to a first voltage, configured to provide the first voltage to the path blocking circuit in response to the clock signal;
    an input provision circuit configured to provide the first voltage as the period signal in response to the input signal; and
    a control circuit connected to a second voltage having a logical state opposite to that of the first voltage, configured to provide the second voltage as the period signal in response to the pulse width control signal to transit the period signal to the predetermined value.

16. The input system according to claim 13, wherein the operation circuit includes a storage unit configured to store pulse-width-controlled data therein.

17. The input system according to claim 12, wherein the latch circuit includes:
    a first latch configured to latch the period signal, invert the period signal, and provide the inverted resultant signal as the output signal; and
    at least one transfer gate configured to provide the output signal as the pulse width detection signal in response to the clock signal.

18. The input system according to claim 17, wherein the latch circuit further includes:
    at least one second latch configured to latch an output signal of the transfer gate.

* * * * *